(12) United States Patent
Matsumoto et al.

(10) Patent No.: US 9,786,382 B1
(45) Date of Patent: Oct. 10, 2017

(54) SEMICONDUCTOR DEVICE AND MEMORY ELEMENT

(71) Applicant: KABUSHIKI KAISHA TOSHIBA, Minato-ku (JP)

(72) Inventors: Mari Matsumoto, Kawasaki (JP); Shinichi Yasuda, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/445,252

(22) Filed: Feb. 28, 2017

(30) Foreign Application Priority Data

Sep. 16, 2016 (JP) .................. 2016-181858

(51) Int. Cl.
| | |
|---|---|
| *G11C 17/16* | (2006.01) |
| *H01L 27/118* | (2006.01) |
| *H01L 27/02* | (2006.01) |
| *H01L 23/525* | (2006.01) |
| *H01L 27/112* | (2006.01) |

(52) U.S. Cl.
CPC .......... *G11C 17/16* (2013.01); *H01L 23/5252* (2013.01); *H01L 27/0207* (2013.01); *H01L 27/11206* (2013.01); *H01L 27/11807* (2013.01); *H01L 2027/11866* (2013.01); *H01L 2027/11885* (2013.01)

(58) Field of Classification Search
CPC . G11C 17/16; H01L 23/5252; H01L 27/0207; H01L 27/11206; H01L 27/11807; H01L 2027/11866; H01L 2027/11885
See application file for complete search history.

(56) References Cited

U.S. PATENT DOCUMENTS

| | | | |
|---|---|---|---|
| 5,537,056 A | 7/1996 | McCollum | |
| 6,426,517 B2 | 7/2002 | Hayakawa et al. | |
| 7,755,162 B2 * | 7/2010 | Kurjanowicz | ......... G11C 17/16 257/288 |

(Continued)

FOREIGN PATENT DOCUMENTS

| | | |
|---|---|---|
| JP | 10-154816 | 6/1998 |
| JP | 2007-194445 | 8/2007 |

(Continued)

*Primary Examiner* — Harry W Byrne
*Assistant Examiner* — R Lance Reidlinger
(74) *Attorney, Agent, or Firm* — Oblon, McClelland, Maier & Neustadt, L.L.P.

(57) ABSTRACT

A memory element according to an embodiment includes: first through fourth impurity layers arranged in a semiconductor layer including first to third portions; a first gate wiring line disposed on the first portion located between the first and second impurity layers; a second gate wiring line disposed on the second portion located between the second and third impurity layers; a third gate wiring line disposed on the third portion located between the third and fourth impurity layers; a first insulating layer disposed between the first portion and the first gate wiring line; a second insulating layer disposed between the second portion and the second gate wiring line; a third insulating layer disposed between the third portion and the third gate wiring line; first wiring line electrically connected to the first through third gate wiring lines; and second wiring line electrically connected to the first through fourth impurity layers.

12 Claims, 17 Drawing Sheets

(56) References Cited

U.S. PATENT DOCUMENTS

| | | | |
|---|---|---|---|
| 9,355,740 | B2 | 5/2016 | Zaitsu et al. |
| 9,514,839 | B2 | 12/2016 | Matsumoto et al. |
| 2009/0323450 | A1 | 12/2009 | Monreal |
| 2017/0125427 | A1* | 5/2017 | Shum ................ H01L 27/11206 |

FOREIGN PATENT DOCUMENTS

| | | |
|---|---|---|
| JP | 2011-527065 | 10/2011 |
| JP | 2015-172989 | 10/2015 |
| JP | 2015-230919 | 12/2015 |

* cited by examiner

ONE INSULATING LAYER BREAKS
I-V CHARACTERISTICS ARE LINEAR

CURRENT DECREASES TO LEAKAGE LEVEL
DUE TO GATE RUPTURE

I-V CHARACTERISTICS AGAIN BECOME LINEAR
ANOTHER GATE INSULATING LAYER BREAKS

SEMICONDUCTOR DEVICE AND MEMORY ELEMENT

CROSS REFERENCE TO RELATED APPLICATIONS

This application is based upon and claims the benefit of priority from prior Japanese Patent Application No. 2016-181858 filed on Sep. 16, 2016 in Japan, the entire contents of which are incorporated herein by reference.

FIELD

Embodiments of the present invention relate to semiconductor devices and memory elements.

BACKGROUND

A programmable logic switch (hereinafter also referred to as a logic switch) is a device that is used in field programmable gate arrays (FPGAs) and the like that need to reconfigure a logical operation circuit or a wiring circuit, and can switch on and off the logic switch in accordance with data stored in a memory. As the memory, a volatile memory such as a static random access memory (SRAM) is conventionally used, and therefore, the data disappears when the power supply is turned off. When the power supply is turned on, the data needs to be again written into the memory.

According to a known technique, a nonvolatile flash memory is used as a memory in a programmable logic switch. By this technique, one cell of a programmable logic switch is formed with two nonvolatile memory transistors and one switching transistor (hereinafter also referred to as a pass transistor). For example, flash memory transistors are used as the memory transistors, and a power supply voltage or 0 V is input to the gate of the switching transistor via one of the two flash memory transistors. As the logic switch has such a structure, the area can be made smaller than that in a case where an SRAM is used as the memory.

Meanwhile, some FPGAs use anti-fuse elements. In such an FPGA, a certain anti-fuse element is put into a low-resistance state. In this manner, wiring lines are electrically connected, to form various circuits.

An FPGA of this type characteristically has irreversible wiring line connections/disconnections. Therefore, there is no possibility that circuit information is unexpectedly changed. That is, such an FPGA can be used in situations where it is difficult to use the above described FPGA including flash memories. However, wiring lines that are once connected cannot be disconnected from one another. Therefore, programming of logical information can be performed basically only once.

DETAILED DESCRIPTION

A memory element according to an embodiment includes: a semiconductor layer; first through fourth impurity layers of a different conductivity type from the semiconductor layer, the first through fourth impurity layers arranged at a distance from one another in the semiconductor layer; first through third gate wiring lines, the first gate wiring line being disposed on a first portion of the semiconductor layer, the first portion being located between the first impurity layer and the second impurity layer, the second gate wiring line being disposed on a second portion of the semiconductor layer, the second portion being located between the second impurity layer and the third impurity layer, the third gate wiring line being disposed on a third portion of the semiconductor layer, the third portion being located between the third impurity layer and the fourth impurity layer; first through third insulating layers, the first insulating layer being disposed between the first portion and the first gate wiring line, the second insulating layer being disposed between the second portion and the second gate wiring line, the third insulating layer being disposed between the third portion and the third gate wiring line; a first wiring line electrically connected to the first through third gate wiring lines; and a second wiring line electrically connected to the first through fourth impurity layers.

The following is a detailed description of embodiments of the present invention, with reference to the accompanying drawings.

First Embodiment

Figure 1A:
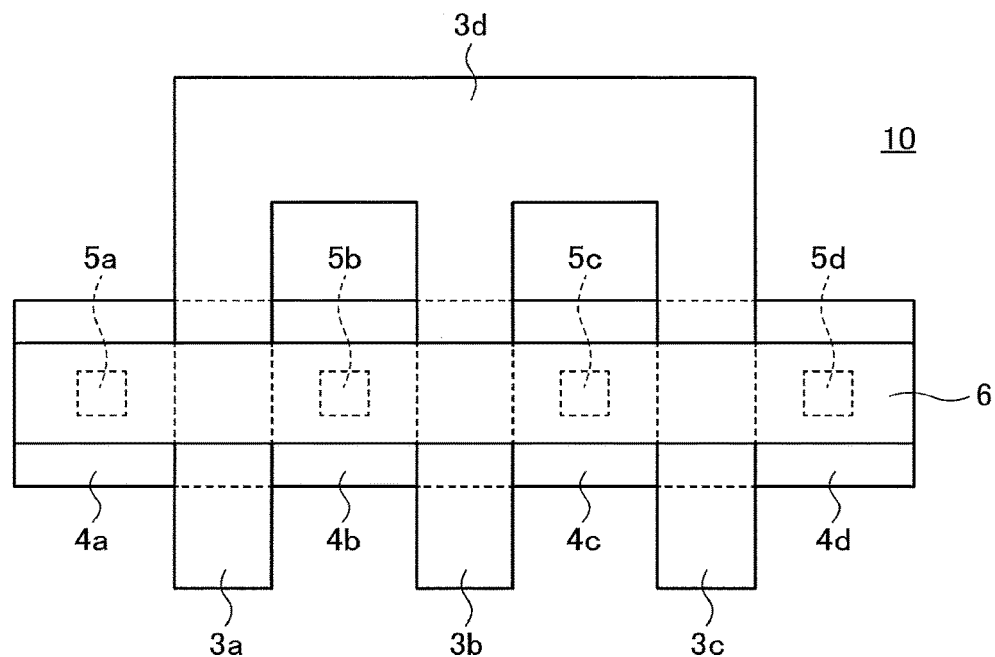
FIG. 1A is a plan view of a memory element of a nonvolatile programmable logic switch according to a first embodiment.
Figure 1B:
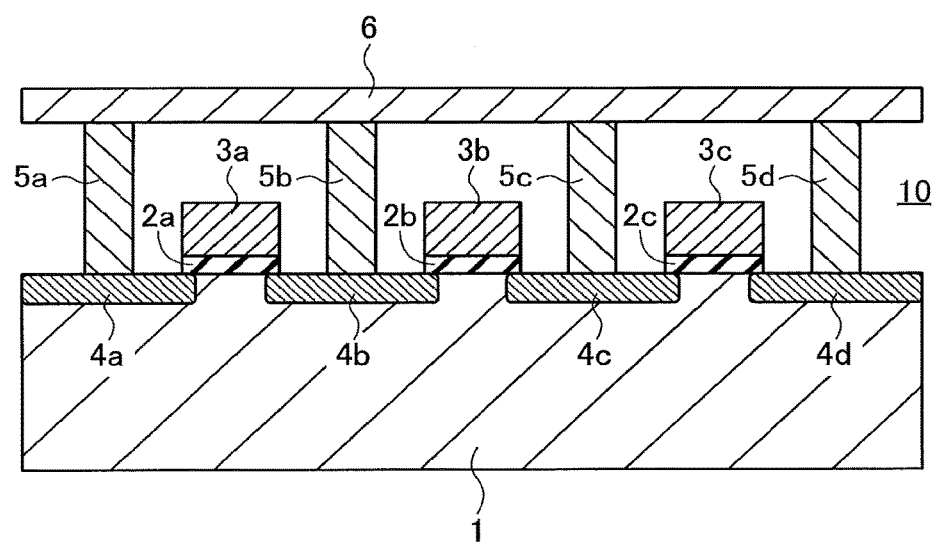
FIG. 1B is a cross-sectional view of the memory element of the nonvolatile programmable logic switch according to the first embodiment.

A semiconductor device according to a first embodiment includes a nonvolatile programmable logic switch (hereinafter also referred to as a logic switch). This logic switch includes a memory, and this memory includes at least one memory element. FIG. 1A is a plan view of this memory element. FIG. 1B is a cross-sectional view of this memory element. This memory element 10 includes transistors (three transistors in the drawings) connected in series. The transistors each share a source or a drain with an adjacent transistor, and have the gates connected at one end. Specifically, the memory element 10 includes: a semiconductor layer 1; gate wiring lines 3a through 3c that are disposed on the semiconductor layer 1 and are formed with polysilicon, for example; a wiring line 3d that connects the gate wiring lines 3a through 3c at one end and is formed with polysilicon, for example; active layers (impurity layers) 4a through 4d that serve as sources or drains; electrodes (conductive portions) 5a through 5d; and a wiring line 6 connected to the electrodes 5a through 5d. Further, insulating layers 2a through 2c are disposed between the semiconductor layer 1 and the respective gate wiring lines 3a through 3c.

The active layers 4a through 4d are of a different conductivity type from that of the semiconductor layer 1. The active layer 4a is formed at the portion of the semiconductor layer 1 located on one side of the gate wiring line 3a, the active layer 4b is formed at the portion of the semiconductor layer 1 located between the gate wiring line 3a and the gate wiring line 3b, the active layer 4c is formed at the portion of the semiconductor layer 1 located between the gate wiring line 3b and the gate wiring line 3c, and the active layer 4d is formed at the portion of the semiconductor layer 1 located on the opposite side of the gate wiring line 3c from the active layer 4c. The electrodes 5a through 5d are connected to the active layers 4a through 4d, respectively.

(Method of Operating the Memory Element)

Referring now to FIGS. 2A through 2H, operations of the memory element 10 having the above structure are described.

First, a write method is described. Here, an example case where the transistors are n-channel MOS transistors is described. A ground voltage is applied to the semiconductor layer 1 and the active layers 4a through 4d of the memory element that performs writing, and a program voltage Vprg is applied to the wiring line 3d. This writing is performed by breaking of a gate insulating layer, and a time TTF required for breaking an insulating layer is normally expressed by the equation shown below.

$$TTF = A_0 \cdot \exp(-\beta E) \quad (1)$$

Here, $A_0$ represents the coefficient, $\beta$ represents the acceleration factor, and E represents the electrical field to be applied to the insulating layer.

As the relationship shown in the equation (1) is established, an insulating layer breaks, and current paths from the gate to both ends of the active layers serving as the source and the drain are formed. At this point, the gate wiring lines 3a through 3c have the same voltage application conditions, but not all the insulating layers 2a through 2c under the three gate wiring lines 3a through 3c do not break at the same time. Instead, a defect first occurs in one of the insulating layers, and the current concentrates on the defective portion, resulting in an expanded current path. However, the current hardly flow in the insulating layers under the other gates. For example, if the insulating layer 2a under the gate wiring line 3a breaks, the insulating layers 2b and 2c under the gate wiring lines 3b and 3c do not break.

Figure 2A:
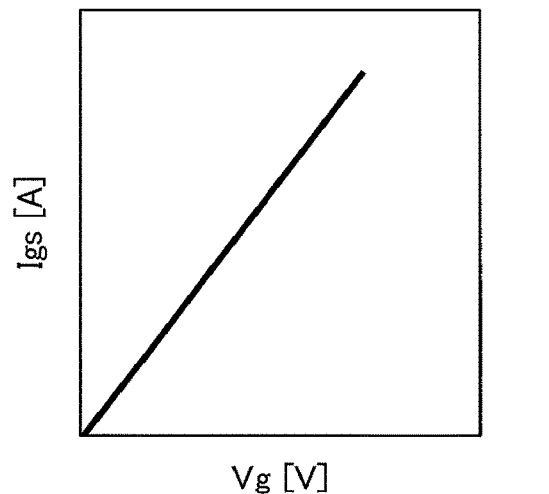
FIGS. 2A through 2H are diagrams for explaining operations of a memory element of the first embodiment.
Figure 2B:
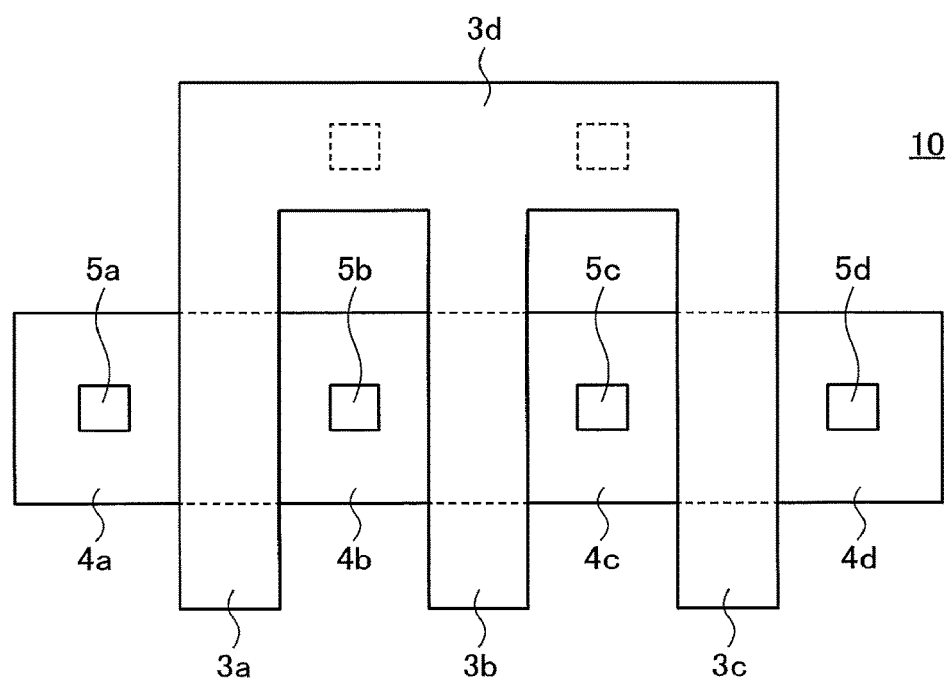
Figure 2C:
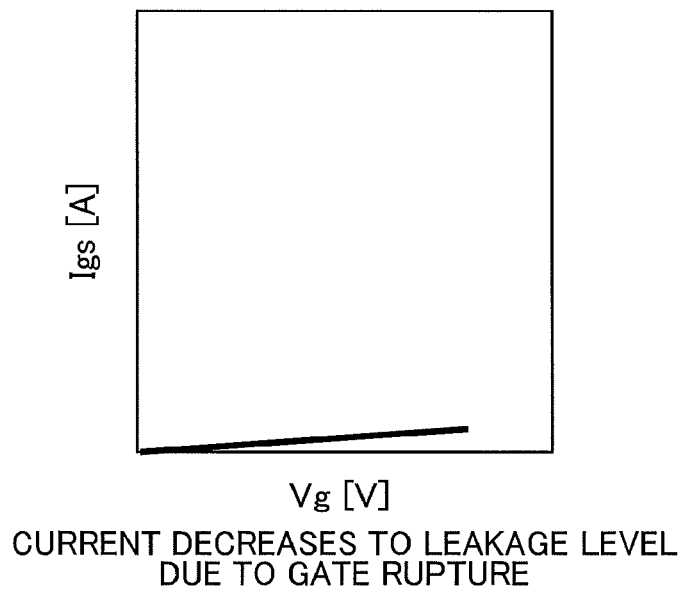

However, the active layers 4a through 4d are connected to the wiring line 6 via the electrodes 5a through 5d, and therefore, a low-resistance state is formed between the gate wiring line 3a and the wiring line 6. In this manner, an anti-fuse write state is formed. As a result, the current flowing between the wiring line 3d and the active layers 4a through 4d serving as the source has linear characteristics as shown in FIG. 2A. At this point, any of the gate wiring lines 3a through 3c has not ruptured in the memory element 10, as shown in FIG. 2B.

Figure 2D:
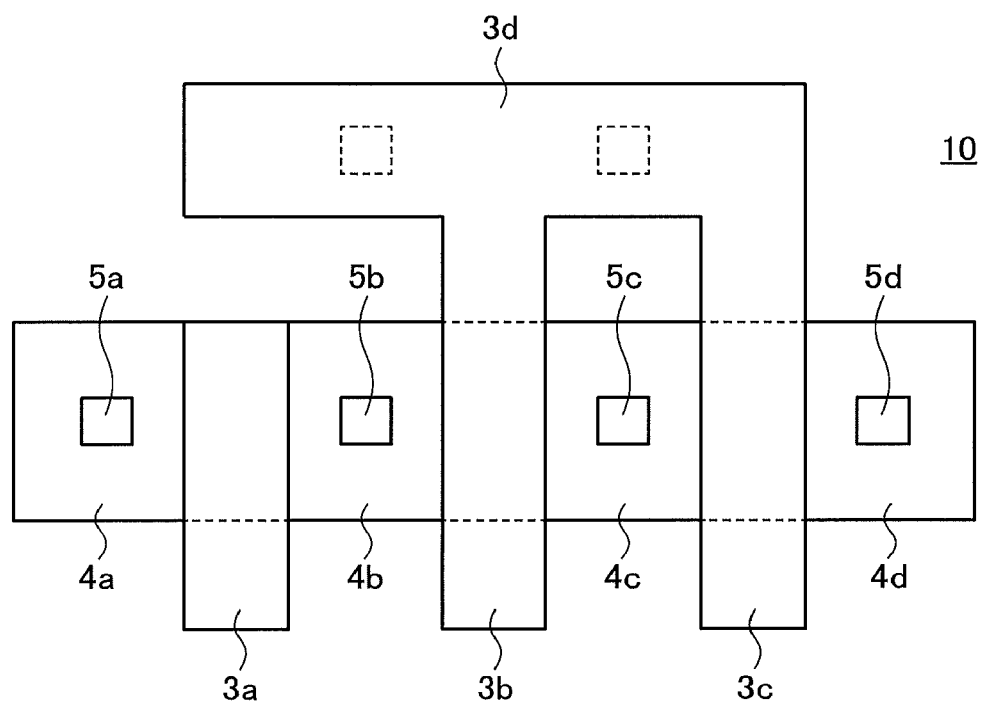

Next, an erase method is described. In a case where the insulating layer 2a under the gate wiring line 3a has broken due to a write operation, the current path extending from the gate wiring line 3a into the current path in the insulating layer 2a is formed so that the current flows into the wiring line 6 via the active layers 4a and 4b serving as the source and the drain, and the electrodes 5a and 5b. At this point, a voltage Vbreak is applied to the wiring line 3d, to increase the density of the current flowing into the gate wiring line 3a, and cause electromigration. In this manner, the gate wiring line 3a is cut off from the wiring line 3d as shown in FIG. 2D. As the gate wiring line 3a is cut off from the wiring line 3d of the memory element 10, the current path formed at the time of writing is also cut off. A high-resistance state is formed between the wiring line 3d and the active layers 4b through 4d serving as the source and the drain as in the initial state, and the current decreases to almost the same as the leakage current between the wiring line 3d and the active layers 4a and 4b serving as the source and the drain (see FIG. 2B). Meanwhile, an electromigration failure model is normally expressed by the equation shown below.

$$MTTF = A \times J^{-n} \times e^{Ea/kT} \quad (2)$$

Here, MTTF represents the mean time to failure (h), A represents a constant determined by the configuration and the material of the wiring lines, n represents another constant (n=2, if the wiring line material is Al), Ea represents the activation energy (eV), k represents the Boltzmann constant, and T represents the absolute temperature (K) of the wiring lines.

At this point, the memory element 10 of this embodiment needs to satisfy TTF<MTTF. For example, when the wiring line width W is 0.23 μm, and the current density is 2 mA, electromigration occurs at 10 μs, and the constant A is approximately $6.8 \times 10^{-32}$.

Figure 2E:
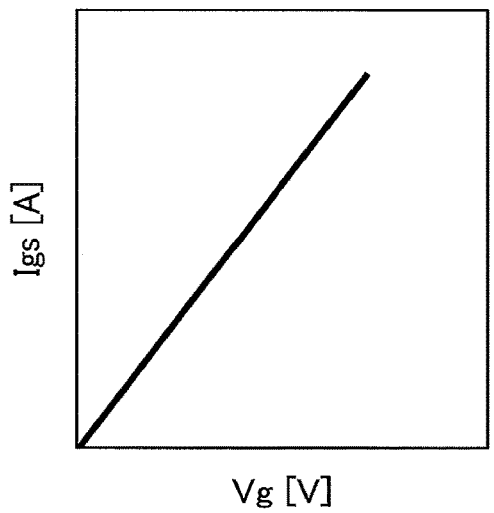
Figure 2F:
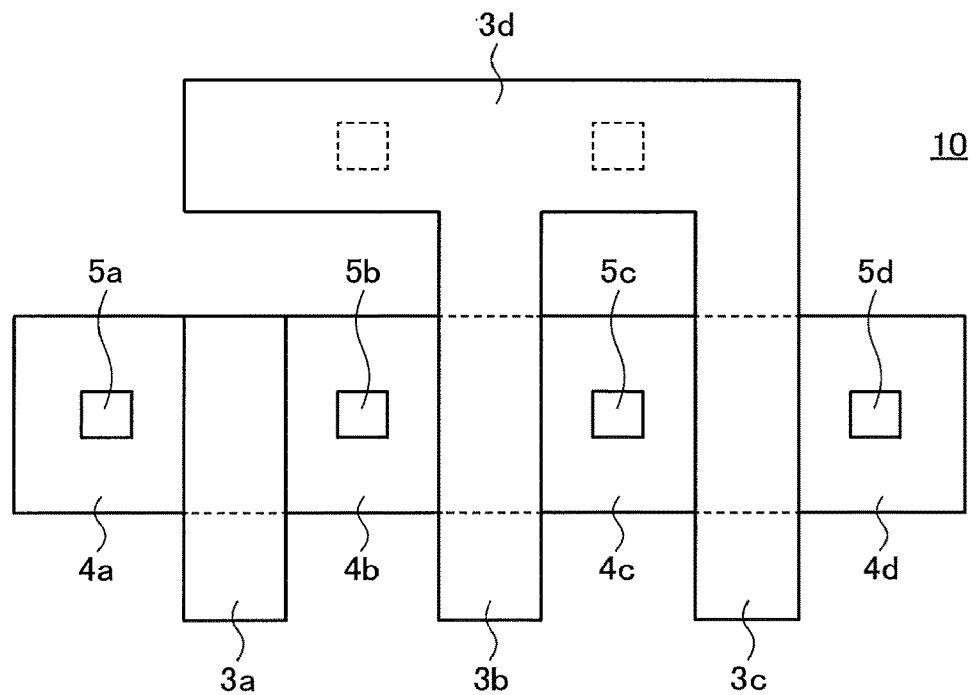
Figure 2G:
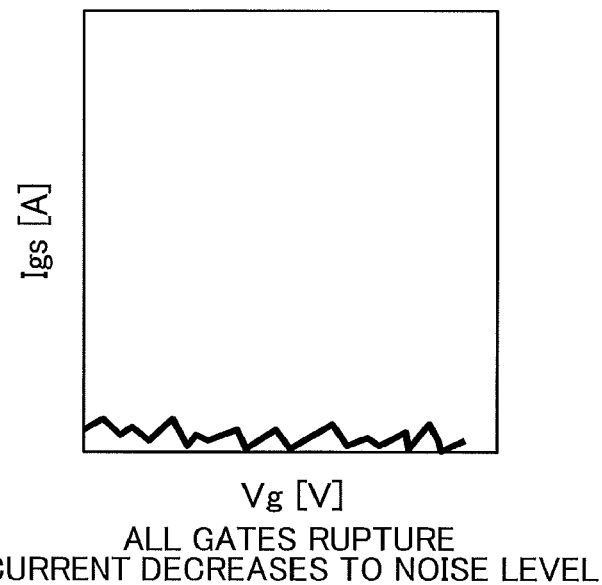

If a write operation is again performed after such erasing is performed, the insulating layer 2b under the gate wiring line 3b breaks, for example, and the current flowing between the wiring line 3d and the active layers 4b through 4d serving as the source and the drain has linear I-V characteristics as shown in FIG. 2E, as in the write operation on the gate wiring line 3a. At this point, the gate wiring line 3b has not ruptured in the memory element 10, as shown in FIG. 2D.

Figure 2H:
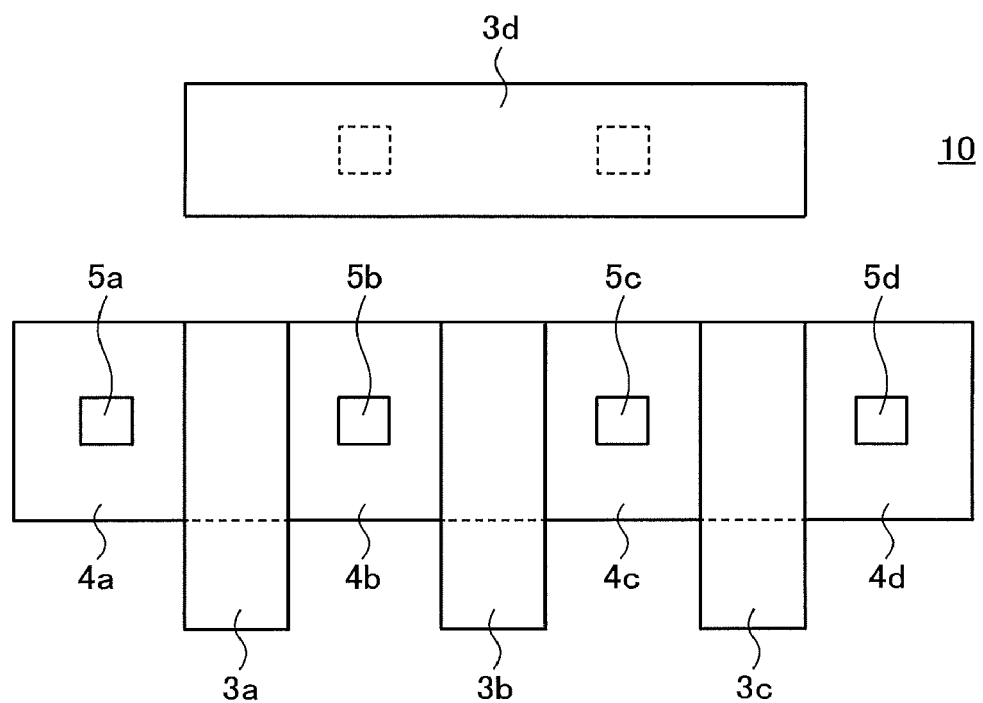

Further, as writing and erasing are performed under all the gate wiring lines 3b and 3c of the memory element 10, all the current paths from the wiring line 3d to the active layers 4a through 4d serving as the source and the drain are cut off as shown in FIG. 2H. As a result, only a current at a noise level flows between the wiring line 3d and the active layers 4a through 4d serving as the source and the drain (see FIG. 2G). Because of such an operation method, the maximum number of times writing and erasing can be performed on the memory element of the first embodiment is determined by the number of the gate wiring lines 3a through 3c. Although the number of the gate wiring lines is three in the above described first embodiment, the number of the gate wiring lines may be four or more. Also, the memory element 10 has the same gate stack structure as that of a logic transistor in the first embodiment, but may be a transistor with a different stack structure. For example, a metal-oxide-nitride-oxide-semiconductor (MONOS) transistor, a transistor using a high-k material for the gate insulating layers, or the like may be used as a memory element. In such a memory element, effects similar to the above described effects can be obtained by applying such a voltage as to cause breaking.

As described above, the memory element of the first embodiment operates as a two-terminal element between the gate and the source/drain by performing the above described write and erase operations.

Referring now to FIGS. 3A through 3E, specific examples of the memory element 10 of the first embodiment are described.

Figure 3A:
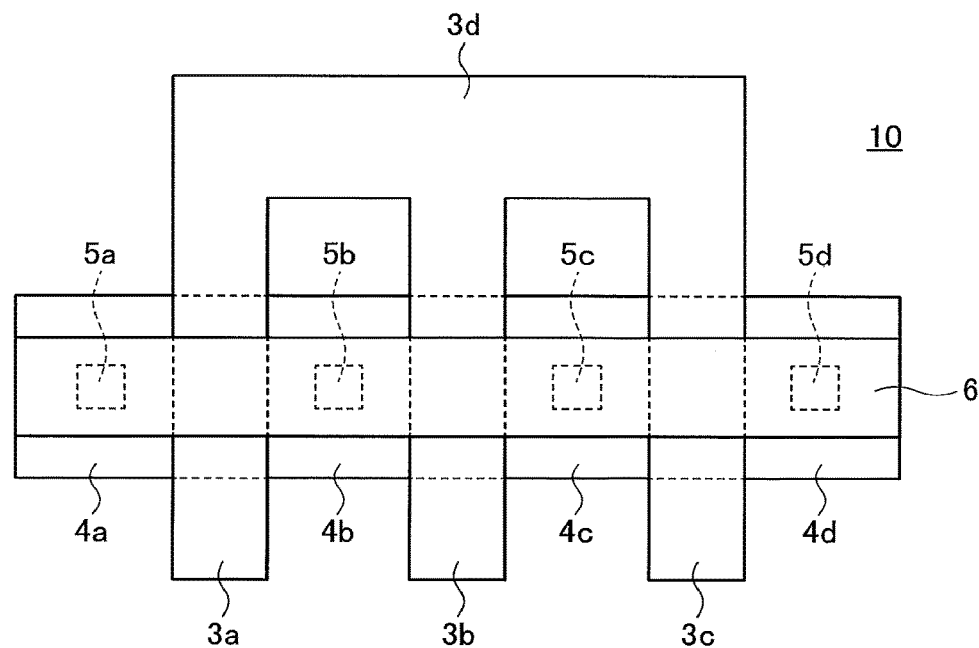
FIGS. 3A through 3E are diagrams showing specific examples of layouts in a memory element of the first embodiment.

FIG. 3A shows a memory element 10 of a first specific example. The memory element 10 of the first specific example has the same configuration as the memory element shown in FIG. 1A, and the gate wiring lines 3a through 3c have the same gate length. In the first specific example, which wiring line of the gate wiring lines 3a through 3c will rupture during writing and erasing is determined by variation at the time of manufacturing.

Figure 3B:
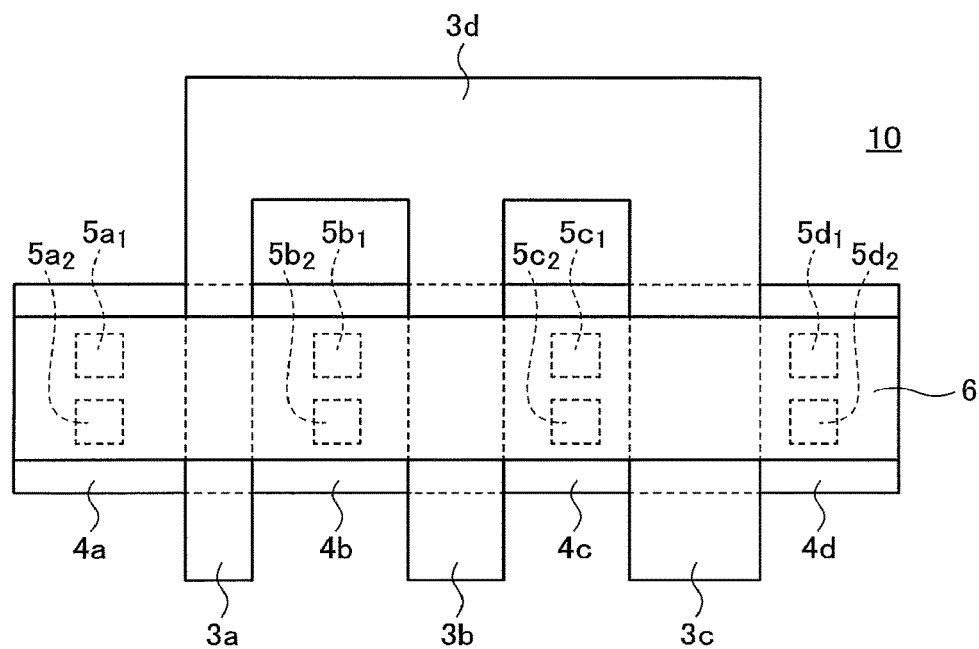

FIG. 3B shows a memory element 10 of a second specific example. The memory element 10 of the second specific example has the same configuration as the memory element of the first specific example shown in FIG. 3A, except that the gate length increases in the order of the gate wiring line 3a, the gate wiring line 3b, and the gate wiring line 3c, and more than one electrode (two electrodes in FIG. 3B) are disposed for each of the active layers 4a through 4d. In the second specific example, as the gate wiring lines have different gate lengths, a higher current can be made to flow in a gate wiring line with a greater gate length. Thus, selective writing and erasing can be readily performed.

Figure 3C:
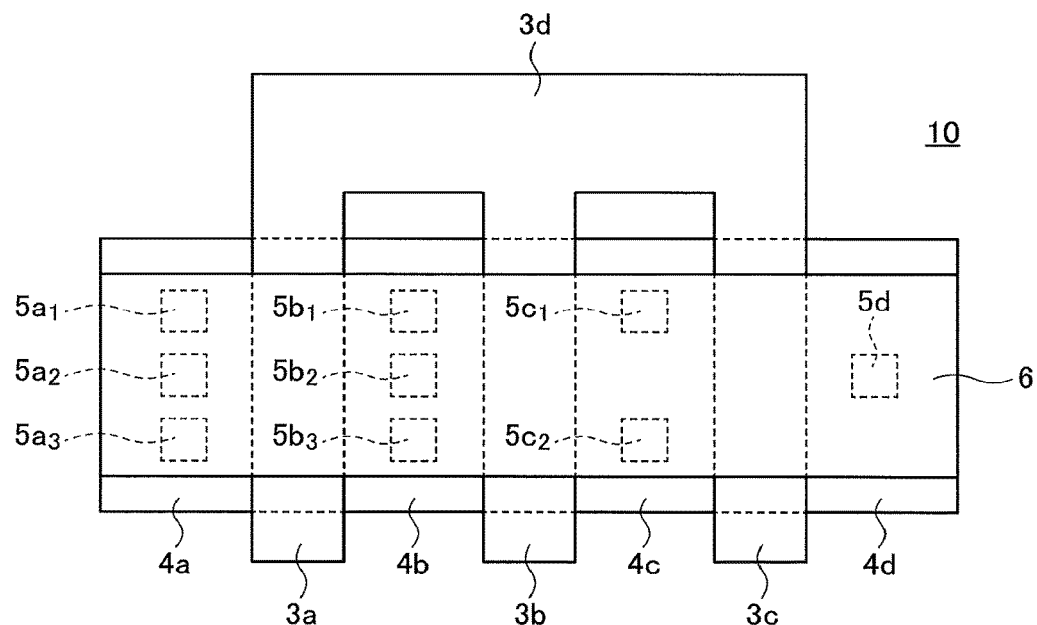

FIG. 3C shows a memory element 10 of a third specific example. The memory element 10 of the third specific example has the same configuration as the memory element shown in FIG. 1A, except that the numbers of electrodes disposed for the respective active layers 4a through 4d are varied. For example, three electrodes $5a_1$ through $5a_3$ are disposed for the active layer 4a, three electrodes $5b_1$ through $5b_3$ are disposed for the active layer 4b, two electrodes $5c_1$ and $5c_2$ are disposed for the active layer 4c, and one electrode 5d is disposed for the active layer 4d. In the third specific example, the numbers of electrodes disposed for the respective active layers are varied, so that the current densities can be varied. As a higher current can be made to flow in an active layer with a larger number of electrodes, selective writing and erasing can be readily performed.

Figure 3D:
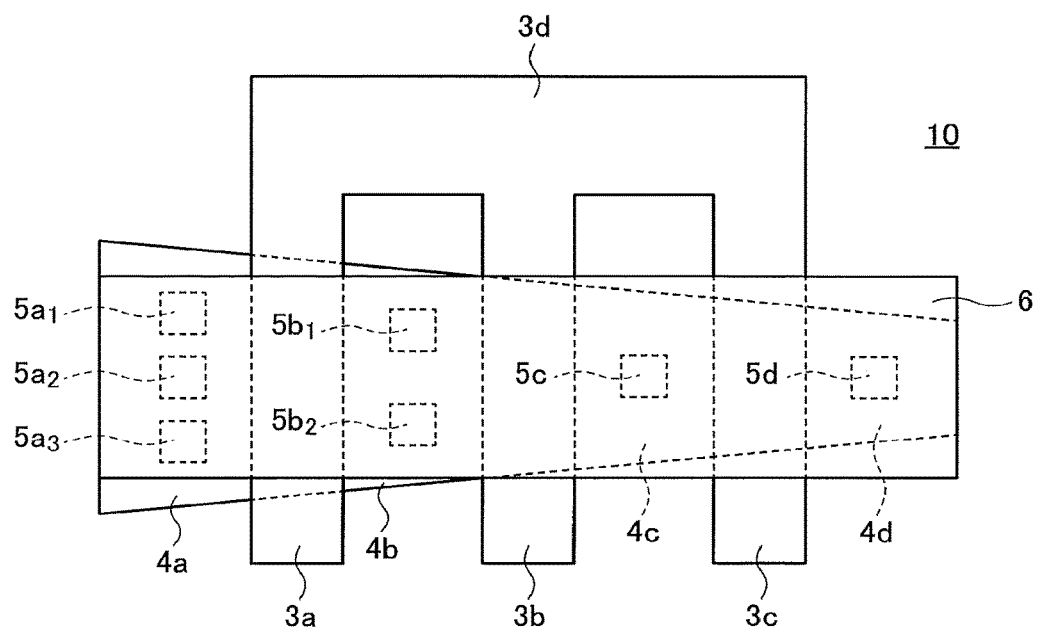

FIG. 3D shows a memory element 10 of a fourth specific example. In the memory element 10 of the fourth specific example, the active layer size in the gate width direction becomes smaller in the order of the active layer 4a, the active layer 4b, the active layer 4c, and the active layer 4d, and the number of electrodes also decreases. In the fourth specific example, as the active layer size in the gate width direction varies, the current densities can be varied. Thus, selective writing and erasing can be readily performed.

Figure 3E:
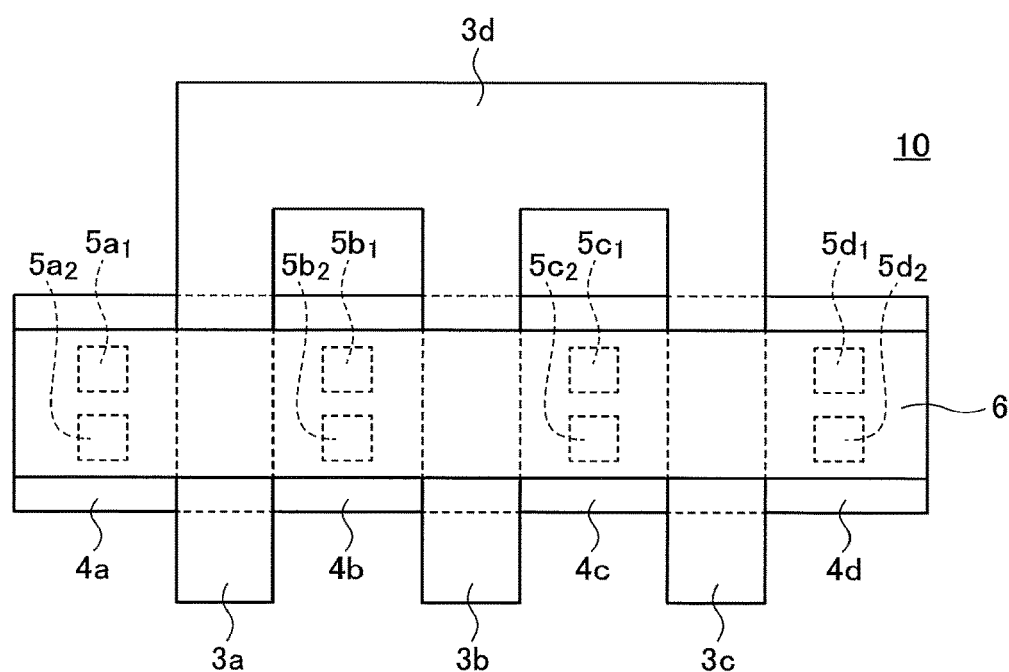

FIG. 3E shows a memory element 10 of a fifth specific example. In the memory element 10 of the fifth specific example, the impurity concentrations of the active layers 4a through 4d are varied. As the impurity concentrations of the active layers 4a through 4d are varied, the voltages necessary for breaking the gate insulating layer can be varied. Thus, selective writing and erasing can be easily performed.

The logic switch of the first embodiment can prevent an increase in chip area more effectively than in a case where SRAMs are used as memories.

As described above, the first embodiment can provide a logic switch that can perform writing twice or more and prevent an increase in chip area.

Second Embodiment

Figure 4:
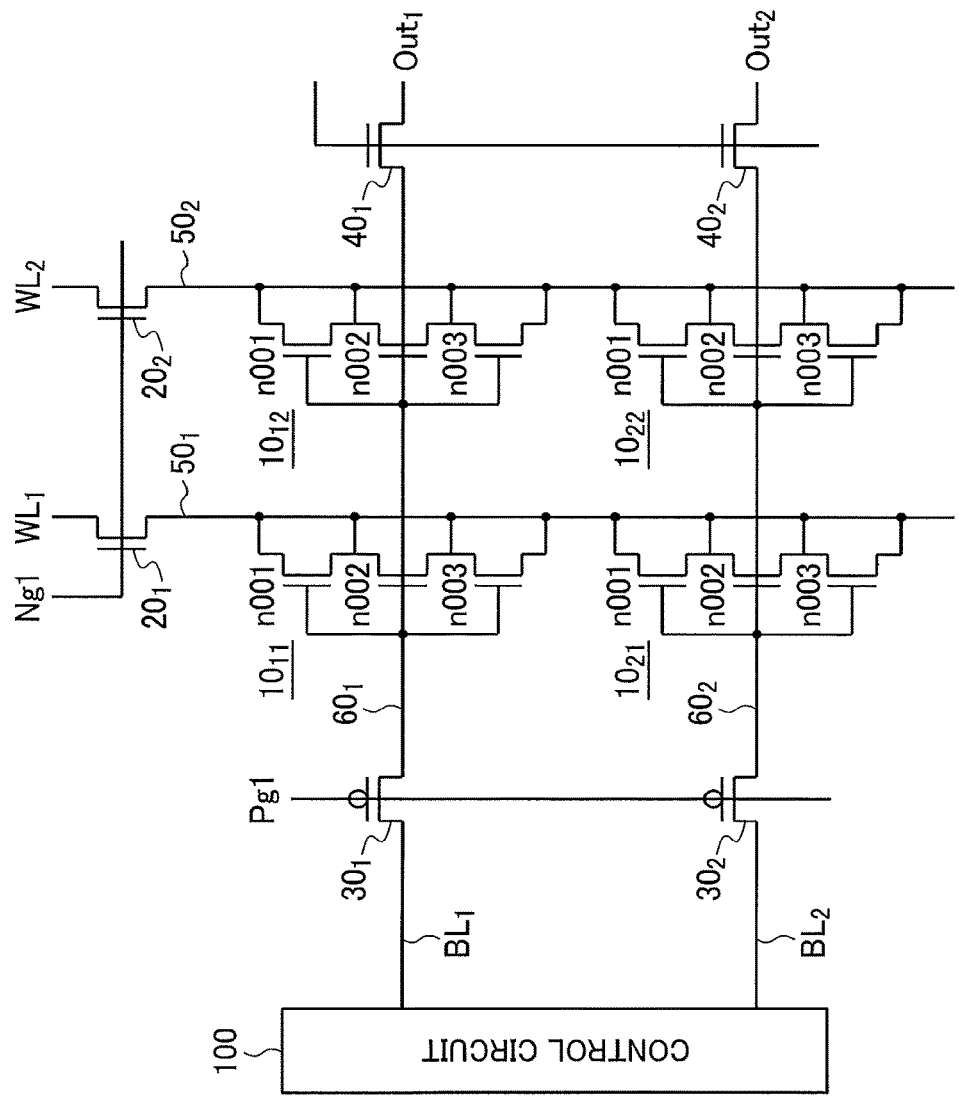
FIG. 4 is a circuit diagram showing a nonvolatile programmable logic switch according to a second embodiment.

Referring now to FIG. 4, a semiconductor device according to a second embodiment is described. The semiconductor device of the second embodiment includes a nonvolatile programmable logic switch (hereinafter also referred to as a logic switch). FIG. 4 is a circuit diagram of this logic switch. The logic switch of the second embodiment includes four memory elements $10_{11}$ through $10_{22}$ arranged in a matrix form, n-channel column select transistors $20_1$ and $20_2$, p-channel program select transistors $30_1$ and $30_2$, n-channel row select transistors $40_1$ and $40_2$, column wiring lines $50_1$ and $50_2$, row wiring lines $60_1$ and $60_2$, and a control circuit 100.

Each memory element $10_{ij}$ (i, j=1, 2) has the same structure as the memory element of the first embodiment, or the memory element 10 shown in FIG. 1A, for example. That is, the memory element $10_{ij}$ (i, j=1, 2) has three gate wiring lines. The memory elements $10_{1j}$ and $10_{2j}$ of the jth (j=1, 2) column each have an active layer connected to the column wiring line $50_j$. The memory elements $10_{i1}$ and $10_{i2}$ of the ith (i=1, 2) row each have the gate connected to the row wiring line $60_i$.

Each of the column select transistors $20_j$ (j=1, 2) has a terminal of the source or the drain connected to a word line $WL_j$, has the other terminal connected to the column wiring line $50_j$, and has the gate (a control terminal) connected to a control line Ng1.

Each of the program select transistors $30_i$ (i=1, 2) has a terminal of the source or the drain connected to a bit line $BL_i$, has the other terminal connected to the row wiring line $60_i$, and has the gate (a control terminal) connected to a program control line Pg1.

Each of the row select transistors $40_i$ (i=1, 2) has a terminal of the source or the drain connected to the row wiring line $60_i$, has the other terminal connected to an output terminal $Out_i$, and has the gate connected to a control line Ng2.

Although the bit lines $BL_1$ and $BL_2$ are connected to the control circuit 100 in FIG. 4, the control circuit 100 performs drive control by applying voltages not only to the bit lines $BL_1$ and $BL_2$ but also to the word lines $WL_1$ and $WL_2$, the control lines Ng1 and Ng2, and the program control line Pg1 during the write operation, the read operation, and the erase operation described later.

(Write Operation)

Figure 5:
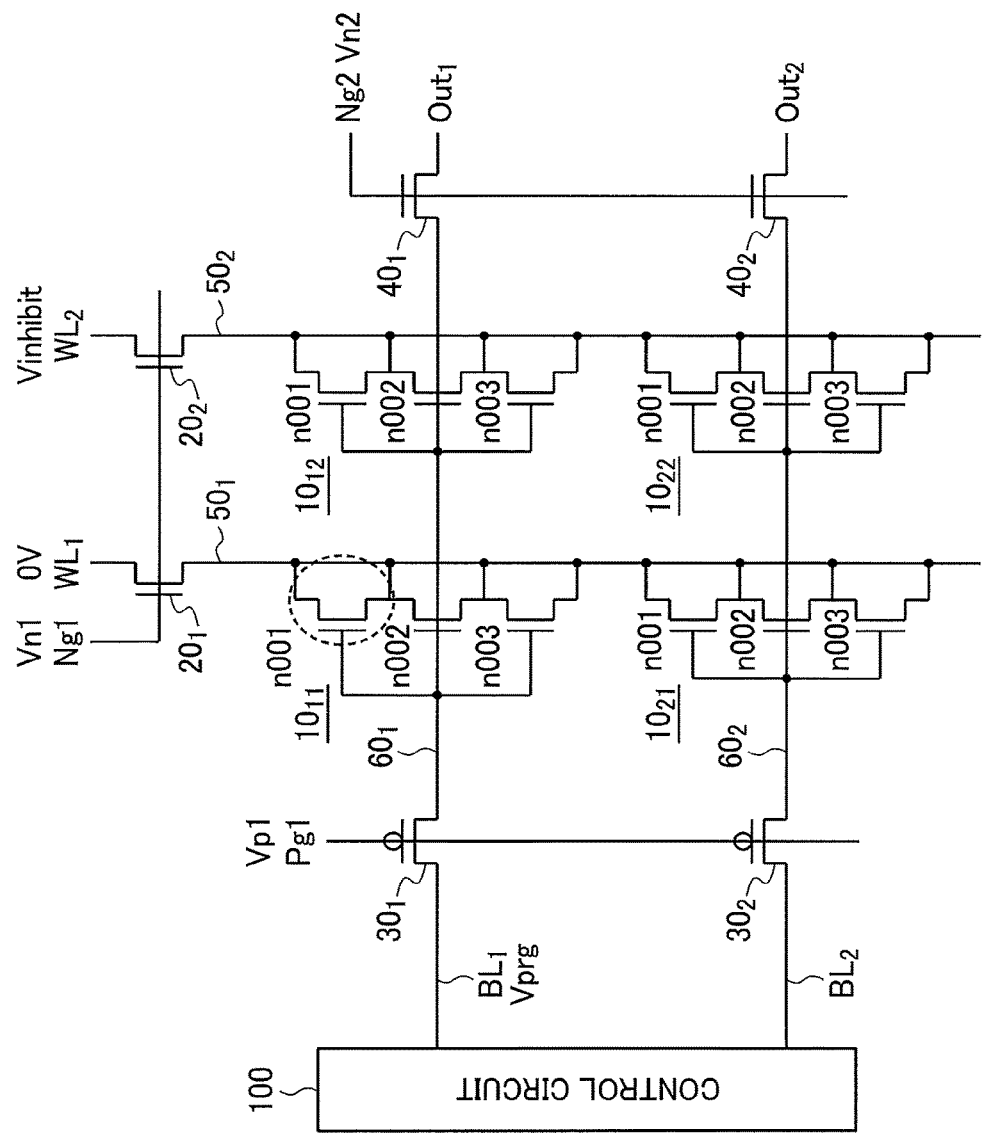
FIG. 5 is a diagram for explaining a write operation of the nonvolatile programmable logic switch according to the second embodiment.

Referring now to FIG. 5, a write operation to be performed on the logic switch of the second embodiment is described. FIG. 5 is a diagram showing the voltages for performing a write operation on the memory element $10_{11}$ of the logic switch shown in FIG. 4. The memory elements $10_{11}$ through $10_{22}$ to be used in this operation are the same as the memory element described in the first embodiment with reference to FIGS. 1A and 1B, and each have three gate wiring lines 3a through 3c so that writing can be performed three times at a maximum.

At a time of writing, a voltage Vp1 (0 V, for example) is applied to the program control line Pg1 so that the program select transistor $30_1$ to which the gate of the memory element $10_{11}$ is connected is turned on, and a program voltage Vprg is applied to the bit line $BL_1$ connected to one of the terminals. Further, a voltage Vn1 is applied to the control line Ng1 so that the column select transistor $20_1$ is turned on. Also, a voltage Vn2 is applied to the control line Ng2 so that the row select transistor $40_1$ is turned on. Here, the word line $WL_1$ is set at 0 V, so that 0 V is applied to the source and the drain of the selected memory element $10_{11}$. At this point of time, a write inhibiting voltage Vinhibit is applied to the word line $WL_2$, so that a write inhibiting voltage is applied to the source and the drain of the unselected memory element $10_{12}$ sharing the row wiring line $60_1$ with the memory element $10_{11}$. For example, as the gate insulating layer breaks at the intersection point (surrounded by a dashed line) between a gate wiring line n001 of the selected memory element $10_{11}$ and the active layers, writing is performed on the memory element $10_{11}$. The write inhibiting voltage Vinhibit is lower than Vprg (Vinhibit<Vprg), and is preferably almost the same as VDD.

(Read Operation)

Figure 6:
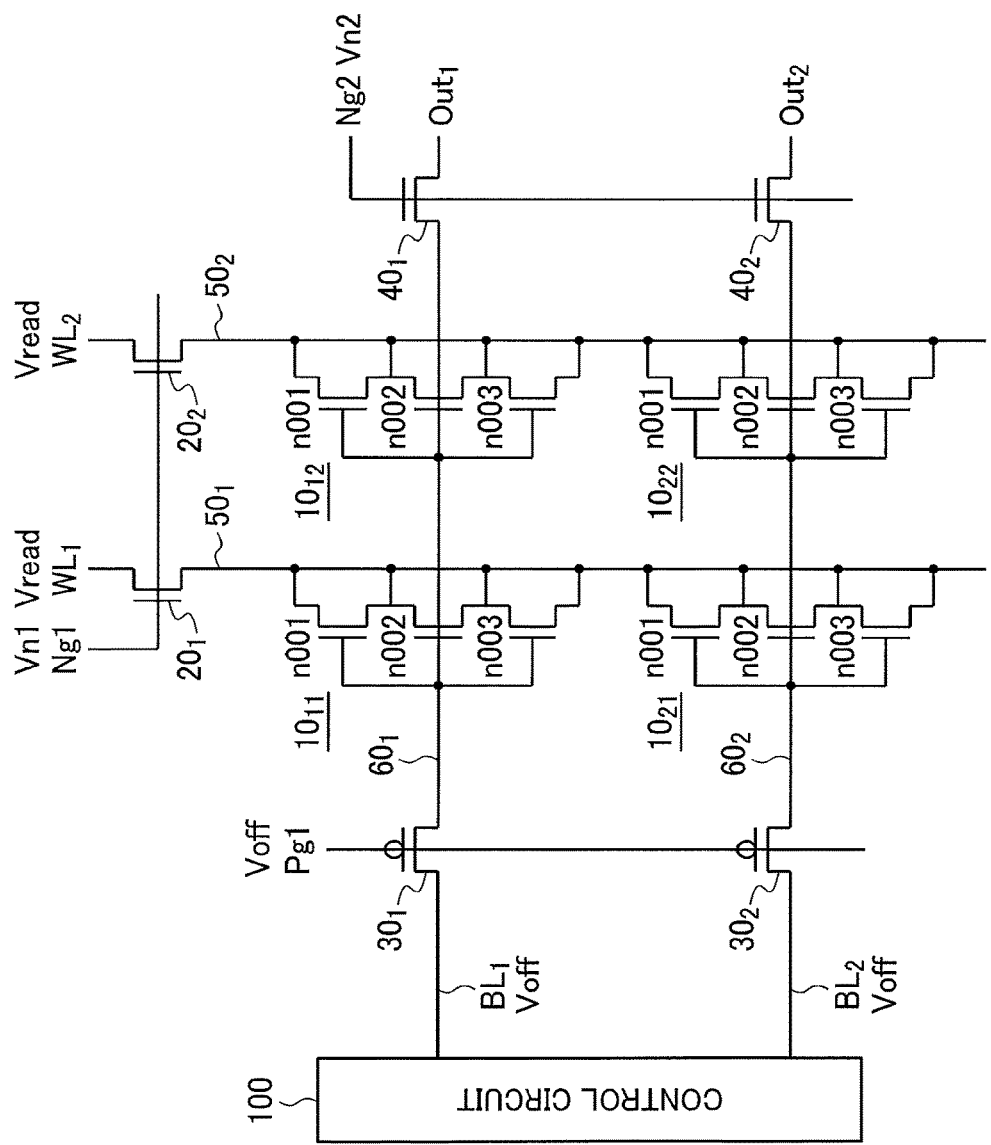
FIG. 6 is a diagram for explaining a read operation of the nonvolatile programmable logic switch according to the second embodiment.

Referring now to FIG. 6, a read operation to be performed on the logic switch of the second embodiment is described. FIG. 6 is a diagram showing the voltages for performing a read operation on the memory element $10_{11}$ of the logic switch shown in FIG. 4.

At a time of reading, a voltage Voff is applied to the gates, the sources, and the substrates of the program select transistors $30_1$ and $30_2$ so that the program select transistors $30_1$ and $30_2$ are turned off. Voltages Vn1 and Vn2 are applied to the control lines Ng1 and Ng2, respectively, so that the row select transistors $40_1$ and $40_2$ and the column select transistors $20_1$ and $20_2$ are turned on. With this, a read signal Vread is applied to the word lines $WL_1$ and $WL_2$, and a low-resistance current path is formed in the memory element on which writing has been performed. Thus, the read signal is output to output terminals $Out_1$ and $Out_2$.

(Erase Operation)

Figure 7:
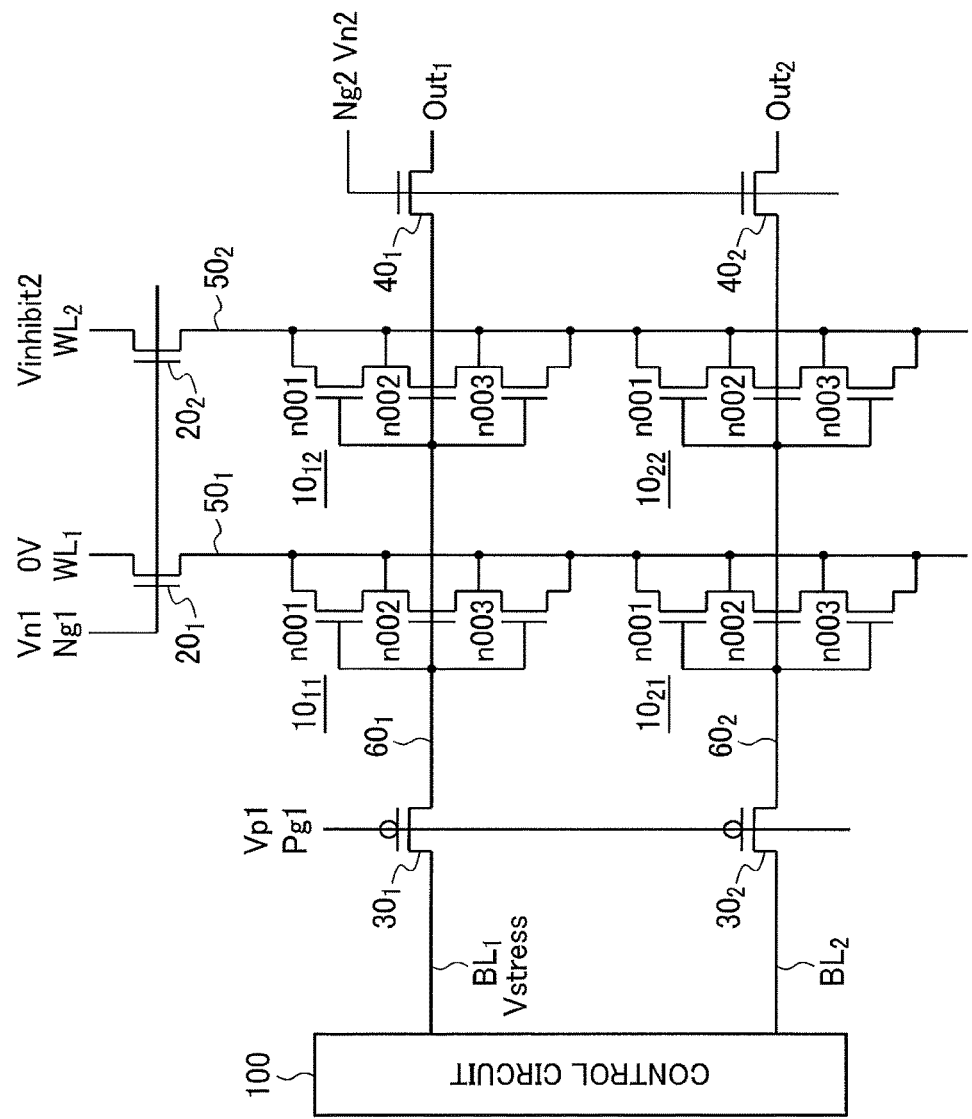
FIG. 7 is a diagram for explaining an erase operation of the nonvolatile programmable logic switch according to the second embodiment.

Referring now to FIG. 7, an erase operation to be performed on the logic switch of the second embodiment is described.

FIG. 7 is a diagram showing the voltages for performing an erase operation after a write operation is performed on the memory element $10_{11}$ of the logic switch shown in FIG. 4.

At a time of erasing, a voltage Vp1 (0 V, for example) is applied to the program control line Pg1 so that the program select transistor $30_1$ to which the gate of the memory element $10_{11}$ is connected is turned on, and a stress voltage Vstress (>0 V) is applied to the bit line $BL_1$. Further, a voltage Vn1 is applied to the control line Ng1 so that the column select transistor $20_1$ is turned on. Also, a voltage Vn2 is applied to the control line Ng2 so that the row select transistor $40_1$ is turned on. Here, the word line $WL_1$ is set at 0 V, so that 0 V is applied to the source and the drain of the selected memory element $10_{11}$. At this point of time, a rupture inhibiting voltage Vinhibit2 is applied to the word line $WL_2$, so that a rupture inhibiting voltage is applied to the source and the drain of the unselected memory element $10_{12}$ sharing the row wiring line $60_1$ with the memory element $10_{11}$. Thus, a gate rupture is prevented. For example, in a case where the gate insulating layer has broken in the cross region between the gate wiring line n001 branching from the row wiring line $60_1$ of the memory element $10_{11}$ selected for writing and the active layers (the active layers 4a through 4d shown in FIGS. 1A and 1B), a gate wiring line (the gate wiring line 3a shown in FIGS. 1A and 1B) ruptures in the cross region due to electromigration. As a result, the gate wiring line n001 is separated from the row wiring line $60_1$, but gate wiring lines n002 and n003 remain connected to the row wiring line $60_1$. Further, any gate insulating layer has not broken in the cross regions between the gate wiring lines n002 and n003 and the active layers. Thus, the memory element $10_{11}$ is put into a high-resistance state like the initial state.

In this manner, a series of write, read, and erase operations can be performed. The maximum number of times writing and erasing can be performed is equal to the number of the gate wiring lines intersecting with the active layers in one memory element.

Figure 8:
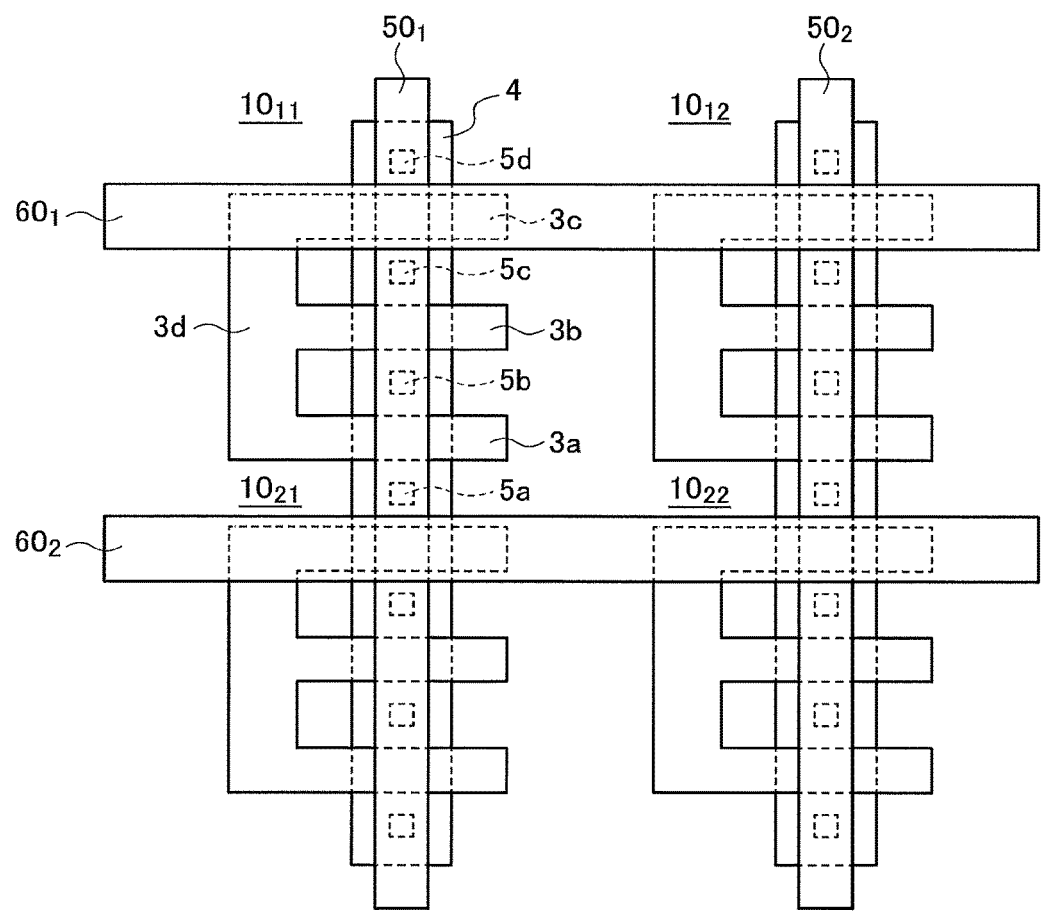
FIG. 8 is a diagram showing a specific example of the layout in the nonvolatile programmable logic switch according to the second embodiment.

The logic switch of the second embodiment having the above structure has the layout shown in FIG. 8, for example.

As described above, like the first embodiment, the second embodiment can also provide a logic switch that can perform writing twice or more and prevent an increase in chip area.

Third Embodiment

Figure 9:
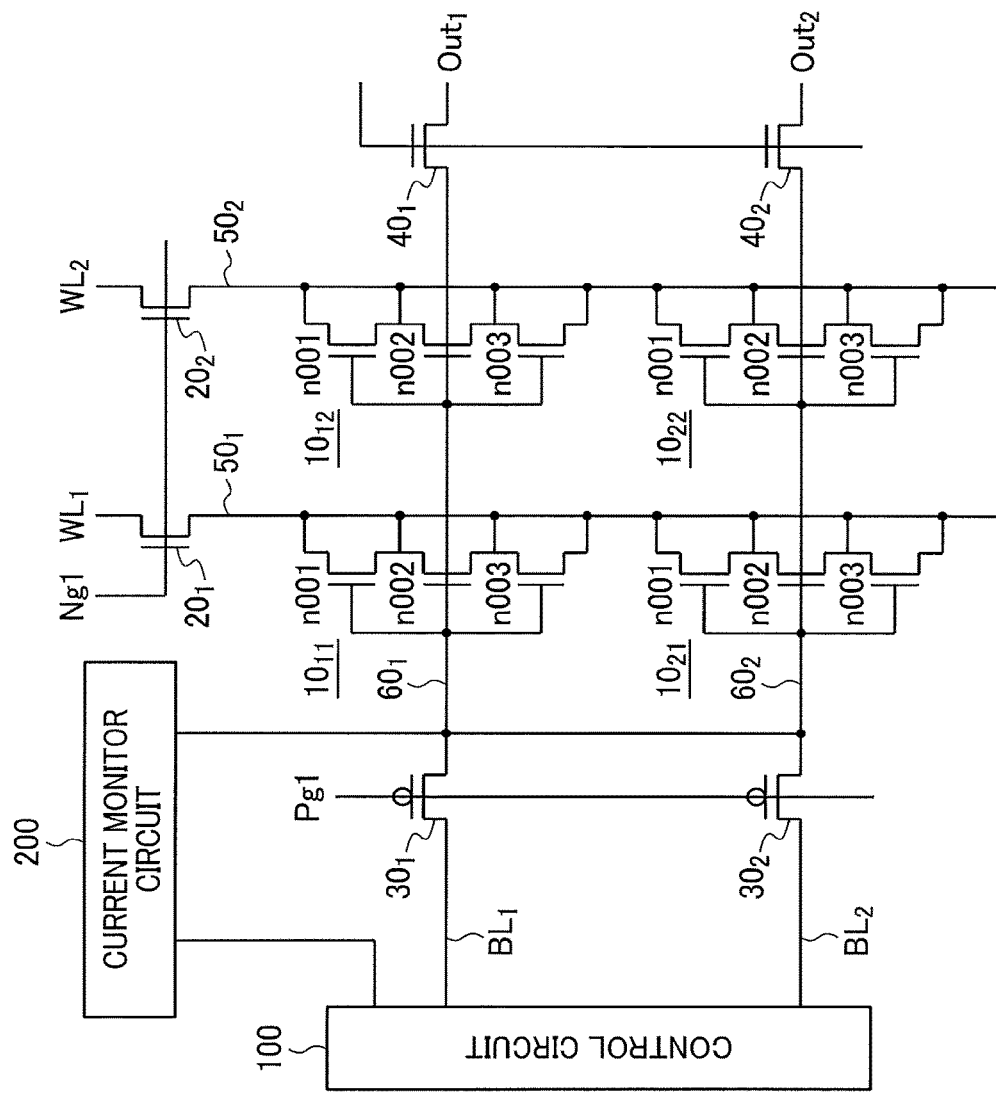
FIG. 9 is a circuit diagram showing a nonvolatile programmable logic switch according to a third embodiment.

Referring now to FIG. 9, a semiconductor device according to a third embodiment is described. The semiconductor device of the third embodiment includes a nonvolatile programmable logic switch (hereinafter also referred to as a logic switch). FIG. 9 shows this logic switch. The logic switch of the third embodiment is the same as the logic switch shown in FIG. 4, except that a current monitor circuit 200 is newly provided.

The current monitor circuit 200 monitors the currents that flow in the row wiring lines $60_1$ and $60_2$ of the memory elements $10_{11}$ through $10_{22}$ at a time of writing and at a time of erasing. In the third embodiment, the control circuit 100 performs drive control by applying voltages not only to the bit lines $BL_1$ and $BL_2$ but also to the word lines $WL_1$ and $WL_2$, the control lines Ng1 and Ng2, and the program control line Pg1 during a write operation, a read operation, and an erase operation, as in the second embodiment. The control circuit 100 also controls the write operation and the erase operation in accordance with current values monitored by the current monitor circuit 200.

(Write Operation)

Figure 10:
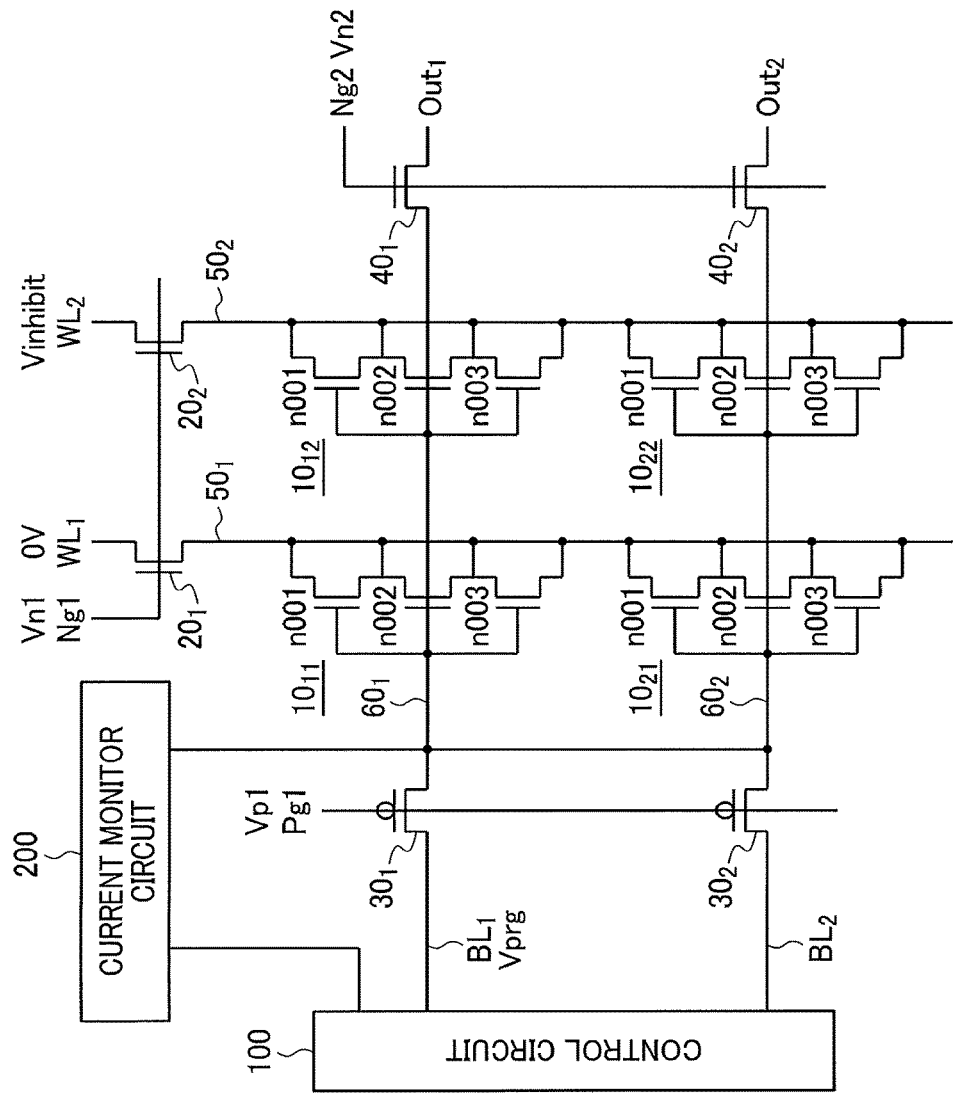
FIG. 10 is a diagram for explaining a write operation of the nonvolatile programmable logic switch according to the third embodiment.

Referring now to FIG. 10, a write operation to be performed on the logic switch of the third embodiment is described.

FIG. 10 is a diagram showing the voltages for performing a write operation on the memory element $10_{11}$ of the logic switch shown in FIG. 9. The memory elements $10_{11}$ through $10_{22}$ to be used in this operation are the same as the memory element described in the first embodiment with reference to FIGS. 1A and 1B, and each have three gate wiring lines 3a through 3c so that writing can be performed three times at a maximum.

At a time of writing, a voltage Vp1 (0 V, for example) is applied to the program control line Pg1 so that the program select transistor $30_1$ to which the gate of the memory element $10_{11}$ is connected is turned on, and a program voltage Vprg is applied to the bit line $BL_1$. Further, a voltage Vn1 is applied to the control line Ng1 so that the column select transistor $20_1$ is turned on. Also, a voltage Vn2 is applied to the control line Ng2 so that the row select transistor $40_1$ is turned on. Here, the word line $WL_1$ is set at 0 V, so that 0 V is applied to the source and the drain of the selected memory element $10_{11}$. At this point of time, a write inhibiting voltage Vinhibit is applied to the word line $WL_2$, so that a write inhibiting voltage is applied to the source and the drain of the unselected memory element $10_{12}$ sharing the row wiring line $60_1$ with the memory element $10_{11}$. For example, as the gate insulating layer breaks at the cross region between a gate wiring line n001 branching from the row wiring line $60_1$ of the selected memory element $10_{11}$ and the active layers, writing is performed on the memory element $10_{11}$.

Also, at a time of writing, the current monitor circuit 200 monitors the current in the row wiring line $60_1$ to which the gate of the memory element $10_{11}$ having writing performed thereon is connected. When writing is performed or a gate insulating layer breaks, conduction paths are formed between the gate and the source and between the gate and the drain of the memory element $10_{11}$ on which writing is performed. As a result, the amount of current increases. With the signal at the time of the increase being the trigger, the write control circuit 100 stops applying the program voltage Vprg. The program voltage may be input with one pulse until a notice of a current increase is received the trigger, or writing may be ended when the trigger as a notice of a current increase is received after a short pulse is input more than once. A write inhibiting voltage Vinhibit is lower than Vprg (Vinhibit<Vprg), and is preferably almost the same as VDD.

(Read Operation)

Figure 11:
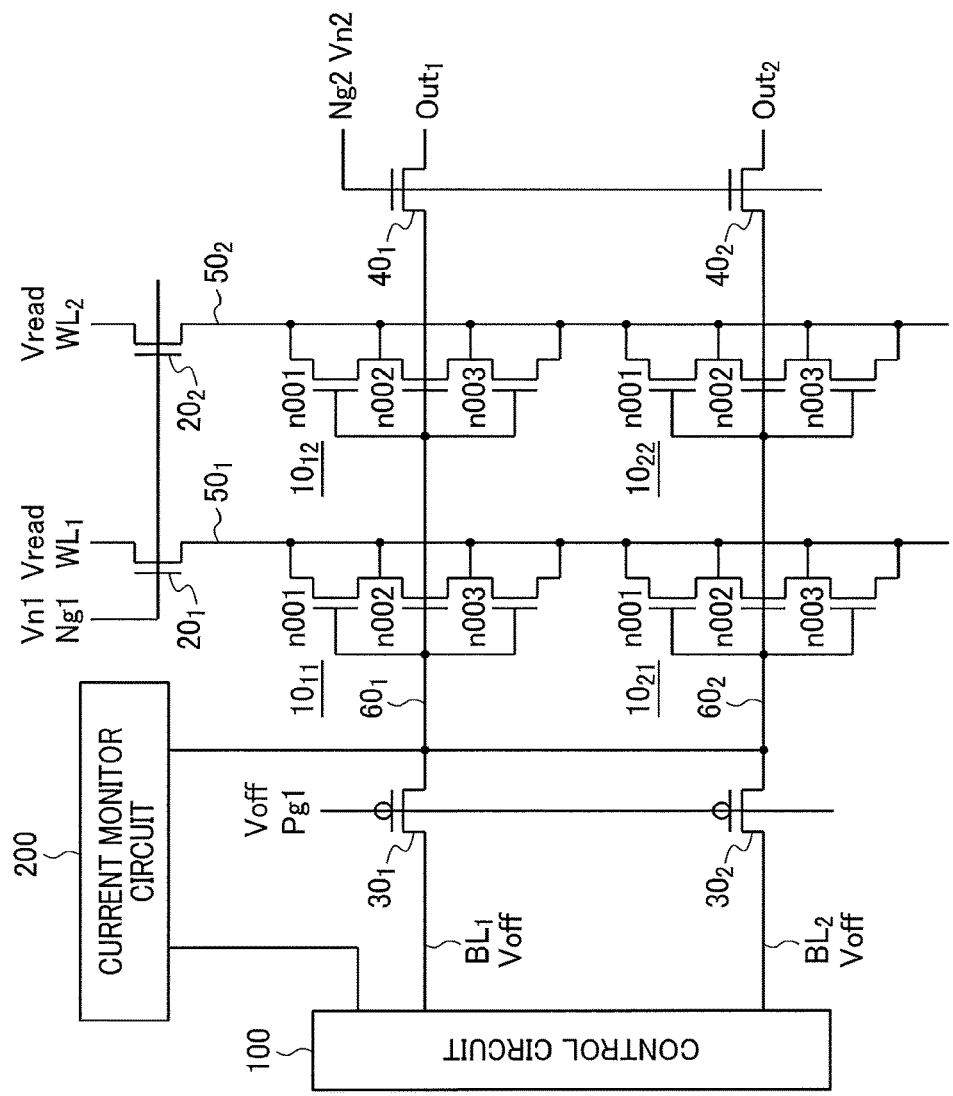
FIG. 11 is a diagram for explaining a read operation of the nonvolatile programmable logic switch according to the third embodiment.

Referring now to FIG. 11, a read operation to be performed on the logic switch of the third embodiment is described. FIG. 11 is a diagram showing the voltages for performing a read operation on the memory element $10_{11}$ of the logic switch shown in FIG. 10.

At a time of reading, a voltage Voff is applied to the gates, the sources, and the substrates of the program select transistors $30_1$ and $30_2$ so that the program select transistors $30_1$ and $30_2$ are turned off. Voltages Vn1 and Vn2 are applied to the control lines Ng1 and Ng2, respectively, so that the row select transistors $40_1$ and $40_2$ and the column select transistors $20_1$ and $20_2$ are turned on. With this, a read signal Vread is applied to the word lines $WL_1$ and $WL_2$, and a low-resistance current path is formed in the memory element on which writing has been performed. Thus, the read signal is output to output terminals $Out_1$ and $Out_2$.

(Erase Operation)

Figure 12:
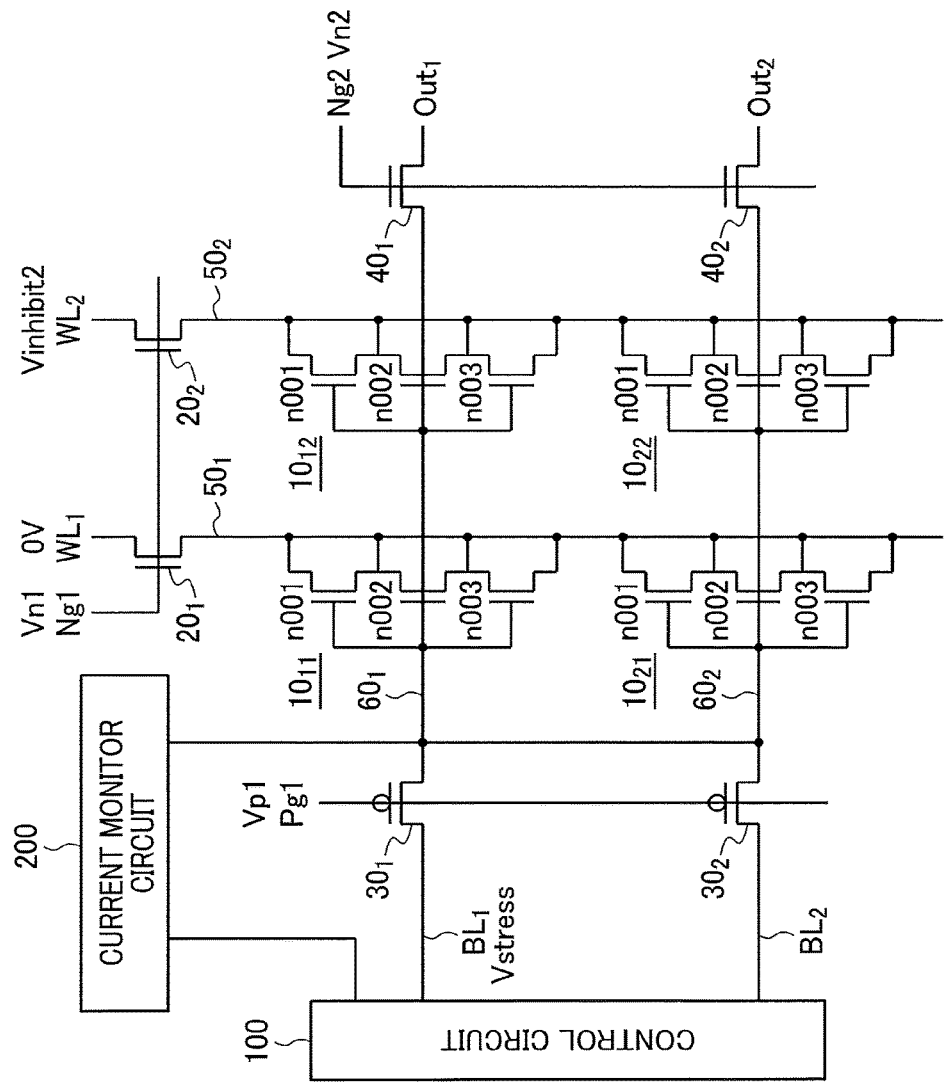
FIG. 12 is a diagram for explaining an erase operation of the nonvolatile programmable logic switch according to the third embodiment.

Referring now to FIG. 12, an erase operation to be performed on the logic switch of the third embodiment is described. FIG. 12 is a diagram showing the voltages for performing an erase operation after a write operation is performed on the memory element $10_{11}$ of the logic switch shown in FIG. 10.

At a time of erasing, a voltage Vp1 (0 V, for example) is applied to the program control line Pg1 so that the program select transistor $30_1$ to which the gate of the memory element $10_{11}$ is connected is turned on, and a stress voltage Vstress (>0 V) is applied to the bit line $BL_1$. Further, a voltage Vn1 is applied to the control line Ng1 so that the column select transistor $20_1$ is turned on. Also, a voltage Vn2 is applied to the control line Ng2 so that the row select transistor $40_1$ is turned on. Here, the word line $WL_1$ is set at 0 V, so that 0 V is applied to the source and the drain of the selected memory element $10_{11}$. At this point of time, a gate rupture inhibiting voltage Vinhibit2 is applied to the word line $WL_2$, so that a gate rupture inhibiting voltage is applied to the source and the drain of the unselected memory element $10_{12}$ sharing the row wiring line $60_1$ with the memory element $10_{11}$. Thus, a gate insulating layer rupture is prevented. For example, in a case where the gate insulating layer has broken in the cross region between the gate wiring line n001 branching from the row wiring line $60_1$ of the selected memory element $10_{11}$ and the active layers, a gate wiring line ruptures in the cross region due to electromigration. As a result of this, the gate wiring line n001 is separated from the row wiring line $60_1$. However, gate wiring lines n002 and n003 remain connected to the row wiring line $60_1$. Further, any gate insulating layer has not broken in the cross regions between the gate wiring lines n002 and n003 and the active layers. Thus, the memory element $10_{11}$ is put into a high-resistance state like the initial state.

Also, when a stress voltage is applied from the bit line $BL_1$, the current monitor circuit 200 monitors the current in the row wiring line (the tow wiring line $60_1$, for example) to which the gate of the memory element (the memory element $10_{11}$, for example) having writing performed thereon is connected, as in the write operation. When erasing is performed or electromigration of the gate wiring line n001 occurs, the row wiring line $60_1$ is cut off from the conduction path due to the gate wiring line rupture, and the amount of current rapidly decreases. As the signal at the time of the current decrease being the trigger, the write control circuit 100 stops applying the stress voltage Vstress. The stress voltage may be input with one pulse until a notice of a current decrease is received as the trigger, or the erase operation may be ended when the trigger as a notice of a current decrease is received after a short pulse is input more than once.

In this manner, a series of write, read, and erase operations can be performed. The maximum number of times writing and erasing can be performed is equal to the number of the gate wiring lines intersecting with the active layers in one memory element.

As described above, like the second embodiment, the third embodiment can also provide a logic switch that can perform writing twice or more and prevent an increase in chip area.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory element comprising:
    a semiconductor layer;
    first through fourth impurity layers of a different conductivity type from the semiconductor layer, the first through fourth impurity layers arranged at a distance from one another in the semiconductor layer;
    first through third gate wiring lines, the first gate wiring line being disposed on a first portion of the semiconductor layer, the first portion being located between the first impurity layer and the second impurity layer, the second gate wiring line being disposed on a second portion of the semiconductor layer, the second portion being located between the second impurity layer and the third impurity layer, the third gate wiring line being disposed on a third portion of the semiconductor layer, the third portion being located between the third impurity layer and the fourth impurity layer;
    first through third insulating layers, the first insulating layer being disposed between the first portion and the first gate wiring line, the second insulating layer being disposed between the second portion and the second gate wiring line, the third insulating layer being disposed between the third portion and the third gate wiring line;
    a first wiring line electrically connected to the first through third gate wiring lines; and
    a second wiring line electrically connected to the first through fourth impurity layers.

2. The element according to claim 1, further comprising first through fourth conductive portions disposed between the second wiring line and the first through fourth impurity layers, respectively.

3. The element according to claim 1, wherein the first wiring line is connected to an end portion of each of the first through third gate wiring lines.

4. A semiconductor device comprising:
the memory element according to claim 1;
a third wiring line connected to the first wiring line; and
a fourth wiring line intersecting with the third wiring line, the fourth wiring line being connected to the second wiring line.

5. The device according to claim 4, further comprising a control circuit electrically connected to the third and fourth wiring lines.

6. The device according to claim 5, further comprising a first transistor having one of a source and a drain connected to the third wiring line, the other one of the source and the drain being connected to the control circuit.

7. The device according to claim 5, wherein, when writing is performed on the memory element, the control circuit applies a first voltage to break one of the first through third insulating layers, the first voltage being applied between the third wiring line and the fourth wiring line.

8. The device according to claim 5, wherein, when reading from the memory element is performed, the control circuit applies a read signal to the fourth wiring line.

9. The device according to claim 7, wherein, when an erase operation is performed on the memory element, the control circuit applies a second voltage to the third wiring line, to rupture one of the first through third gate wiring lines.

10. The device according to claim 9, further comprising a monitor circuit configured to monitor a current flowing in the third wiring line,
wherein the control circuit stops applying one of the first voltage and the second voltage, in accordance with a signal from the monitor circuit.

11. The device according to claim 4, further comprising first through fourth conductive portions disposed between the second wiring line and the first through fourth impurity layers, respectively.

12. The device according to claim 4, wherein the first wiring line is connected to an end portion of each of the first through third gate wiring lines.

* * * * *